United States Patent
Lim et al.

(10) Patent No.: US 10,051,727 B2
(45) Date of Patent: *Aug. 14, 2018

(54) ELECTRICALLY-CONDUCTIVE STRUCTURE AND A PRODUCTION METHOD THEREFOR

(71) Applicant: LG CHEM, LTD., Seoul (KR)

(72) Inventors: Jin Hyong Lim, Seoul (KR); Song Ho Jang, Daejeon (KR); Jin Woo Park, Daejeon (KR); Ki-Hwan Kim, Daejeon (KR); In-Seok Hwang, Daejeon (KR); Chung Wan Kim, Daejeon (KR); Seung Heon Lee, Daejeon (KR); Beom Mo Koo, Daejeon (KR); Ji Young Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 113 days.

This patent is subject to a terminal disclaimer.

(21) Appl. No.: 15/098,775

(22) Filed: Apr. 14, 2016

(65) Prior Publication Data

US 2017/0238413 A1    Aug. 17, 2017

Related U.S. Application Data

(63) Continuation of application No. 13/994,448, filed as application No. PCT/KR2012/001585 on Mar. 2, 2012.

(30) Foreign Application Priority Data

Mar. 4, 2011    (KR) .................. 10-2011-0019598

(51) Int. Cl.
*H01L 31/18*    (2006.01)
*H01L 31/0236*    (2006.01)
(Continued)

(52) U.S. Cl.
CPC ........... *H05K 1/0274* (2013.01); *G06F 3/041* (2013.01); *G06F 3/044* (2013.01); *G06F 3/045* (2013.01);
(Continued)

(58) Field of Classification Search
CPC ....... H05K 2201/03; H05K 2201/0317; H05K 2201/032; H05K 2201/0332;
(Continued)

(56) References Cited

U.S. PATENT DOCUMENTS

| 4,331,737 A | 5/1982 | Nishizawa et al. |
| 4,416,952 A | 11/1983 | Nishizawa et al. |

(Continued)

FOREIGN PATENT DOCUMENTS

| CN | 101044579 A | 9/2007 |
| EP | 1801814 A1 | 6/2007 |

(Continued)

OTHER PUBLICATIONS

English equivalent of Abstract for KR 10-2010-0024318, Mar. 2010.

(Continued)

*Primary Examiner* — Susan D Leong
(74) *Attorney, Agent, or Firm* — Dentons US LLP

(57) ABSTRACT

An exemplary embodiment of the present invention relates to a conductive structure body that comprises a darkening pattern layer having AlOxNy, and a method for manufacturing the same. The conductive structure body according to the exemplary embodiment of the present invention may prevent reflection by a conductive pattern layer without affecting conductivity of the conductive pattern layer, and improve a concealing property of the conductive pattern layer by improving absorbance. Accordingly, a display panel having improved visibility may be developed by using the (Continued)

conductive structure body according to the exemplary embodiment of the present invention.

18 Claims, 6 Drawing Sheets

(51) Int. Cl.
| | |
|---|---|
| H05K 1/09 | (2006.01) |
| H05K 1/02 | (2006.01) |
| G06F 3/041 | (2006.01) |
| H01B 1/08 | (2006.01) |
| H05K 3/10 | (2006.01) |
| H05K 7/02 | (2006.01) |
| G06F 3/044 | (2006.01) |
| G06F 3/045 | (2006.01) |
| H01L 31/05 | (2014.01) |
| H05K 3/16 | (2006.01) |
| H05K 3/46 | (2006.01) |
| H03K 17/96 | (2006.01) |
| H05K 1/03 | (2006.01) |
| H02S 40/38 | (2014.01) |

(52) U.S. Cl.
CPC ......... *H01B 1/08* (2013.01); *H01L 31/02366* (2013.01); *H01L 31/05* (2013.01); *H01L 31/18* (2013.01); *H03K 17/962* (2013.01); *H05K 1/0298* (2013.01); *H05K 1/0353* (2013.01); *H05K 1/09* (2013.01); *H05K 3/10* (2013.01); *H05K 3/16* (2013.01); *H05K 3/4644* (2013.01); *H05K 7/02* (2013.01); *G06F 2203/04103* (2013.01); *G06F 2203/04112* (2013.01); *H02S 40/38* (2014.12); *H05K 2201/0317* (2013.01); *Y10T 29/49155* (2015.01); *Y10T 428/24802* (2015.01)

(58) Field of Classification Search
CPC .... H05K 2201/0364; H05K 7/02; H05K 3/10; H05K 1/09; H05K 1/0353; G06F 2203/04112; G06F 3/041; H01L 31/02366
See application file for complete search history.

(56) References Cited

U.S. PATENT DOCUMENTS

| | | | |
|---|---|---|---|
| 5,493,102 | A | 2/1996 | Takase et al. |
| 7,320,815 | B2 | 1/2008 | Ota et al. |
| 8,692,445 | B2 | 4/2014 | Hayashi et al. |
| 8,692,455 | B2 | 4/2014 | Hayashi et al. |
| 8,791,368 | B2 | 7/2014 | Koo et al. |
| 9,357,636 | B2 | 5/2016 | Lim et al. |
| 9,615,450 | B2 | 4/2017 | Hwang et al. |
| 2002/0168478 | A1 | 11/2002 | Kato et al. |
| 2002/0192850 | A1* | 12/2002 | Stoltz .................... G02B 6/124 438/22 |
| 2005/0008834 | A1 | 1/2005 | Chang et al. |
| 2007/0030569 | A1 | 2/2007 | Lu et al. |
| 2007/0120131 | A1* | 5/2007 | Hasegawa ......... H01L 27/14632 257/79 |
| 2007/0210324 | A1 | 9/2007 | Kawaguchi et al. |
| 2007/0224412 | A1 | 9/2007 | Hara et al. |
| 2007/0235822 | A1 | 10/2007 | Clark |
| 2008/0176108 | A1 | 7/2008 | Cheng et al. |
| 2008/0308151 | A1 | 12/2008 | Den Boer et al. |
| 2009/0196998 | A1 | 8/2009 | Nakagame et al. |
| 2010/0053759 | A1 | 3/2010 | Inoue et al. |
| 2010/0111130 | A1 | 5/2010 | Murayama et al. |
| 2010/0291321 | A1* | 11/2010 | Mallikarjunan ........ C23C 16/36 427/579 |
| 2011/0168226 | A1* | 7/2011 | Kim ................ H01L 31/035281 136/244 |
| 2012/0070935 | A1* | 3/2012 | Myong ............. H01L 31/02167 438/69 |
| 2013/0140065 | A1 | 6/2013 | Koo et al. |
| 2013/0215067 | A1* | 8/2013 | Hwang .................. G02B 5/003 345/173 |

FOREIGN PATENT DOCUMENTS

| | | |
|---|---|---|
| EP | 2221884 A1 | 8/2010 |
| JP | 55-013925 A | 1/1980 |
| JP | 06-204536 A | 7/1994 |
| JP | 2000-294041 A | 10/2000 |
| JP | 2004-022441 A | 1/2004 |
| JP | 2006-023904 A | 1/2006 |
| JP | 2006-190716 A | 7/2006 |
| JP | 2008-176915 A | 7/2008 |
| JP | 2009-176198 A | 8/2009 |
| JP | 2010-079240 A | 4/2010 |
| JP | 4575384 B2 | 11/2010 |
| KR | 10-0630595 B1 | 9/2006 |
| KR | 10-2007-0039616 A | 4/2007 |
| KR | 10-2010-0024318 A | 3/2010 |
| TW | I263849 B | 10/2006 |
| WO | 2009-001143 A1 | 12/2008 |
| WO | 2009-064331 A2 | 5/2009 |
| WO | 2011008055 A2 | 1/2011 |

OTHER PUBLICATIONS

Database WPI, Week 198011, Thompson Scientific London, GB: AN 1980-19065C, XP-002726660, JP S55 13925 A (Handotai Kenkyu Shi), Jan. 31, 1980.
International Search Report from PCT/KR2012/001585, dated Sep. 25, 2012.
Search Report of European Patent Office in Appl'n. No. 12754621. 6, dated Jul. 14, 2014.
Search Report of European Patent Office in Appl'n. No. 12755032. 5, dated Jul. 22, 2014.
Office Action of the Japanese Patent Office in Appl'n. No. 2013-556553, dated Aug. 19. 2014.
Office Action of the State Intellectual Property Office of PR of China in Appl'n. No. 201280002347.9, dated Sep. 4, 2014.
Office Action of the Japanese Patent Office in Appl'n. No. 2013-556554, dated Oct. 21, 2014.
Office Action of the European Patent Office in Appl'n. No. 12755032.5, dated Mar. 16, 2015.
Office Action of the European Patent Office in Appl'n. No. 12754621.6, dated Mar. 16, 2015.
Office Action of the Taiwanese Patent Office in Appl'n. No. 101106682, dated Mar. 23, 2015.
Office Action of the Japanese Patent Office in Appl'n. No. 2013-556553, dated Apr. 7, 2015.
Office Action of the Japanese Patent Office in Appl'n. No. 2013-556554, dated Jun. 9, 2015.
Search Report of European Patent Office in Appl'n. No. 12754621. 6, dated Aug. 26, 2015.

* cited by examiner

[Figure 1]
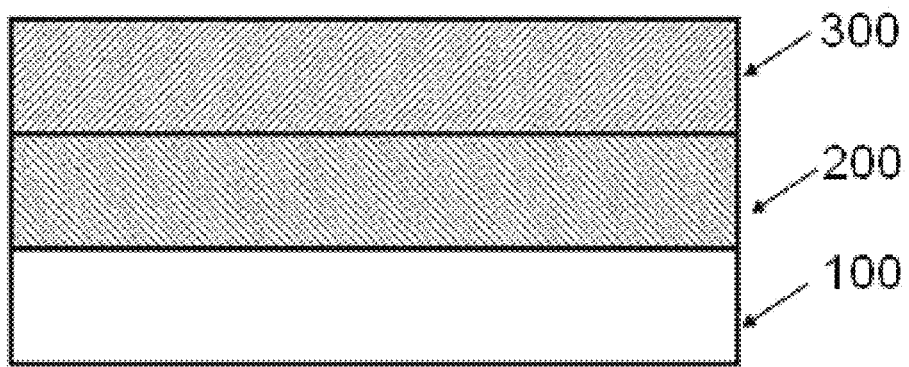
[Figure 2]
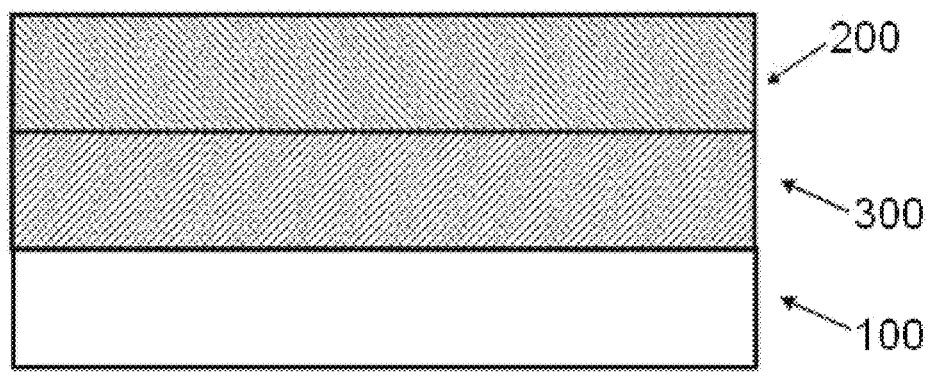

【Figure 3】
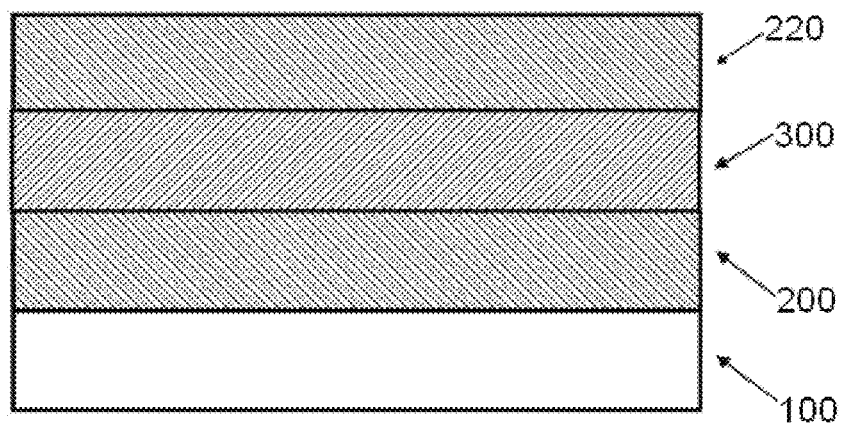
【Figure 4】
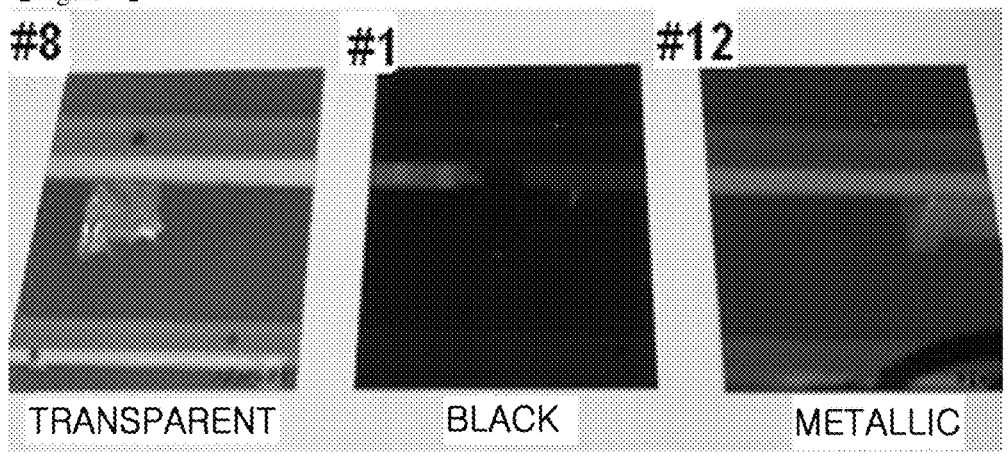

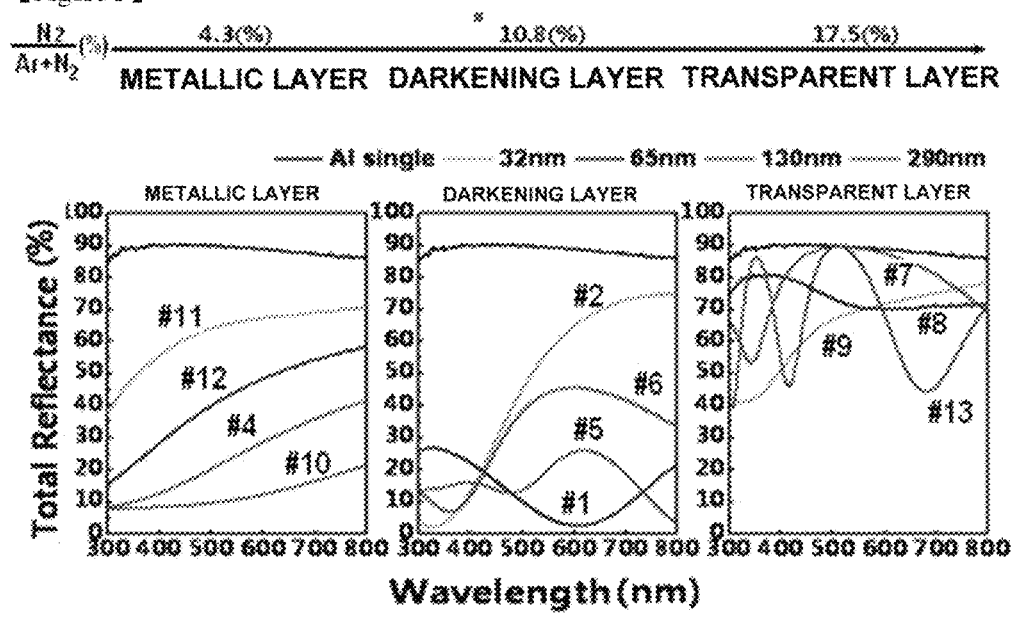
【Figure 5】

[Figure 6]
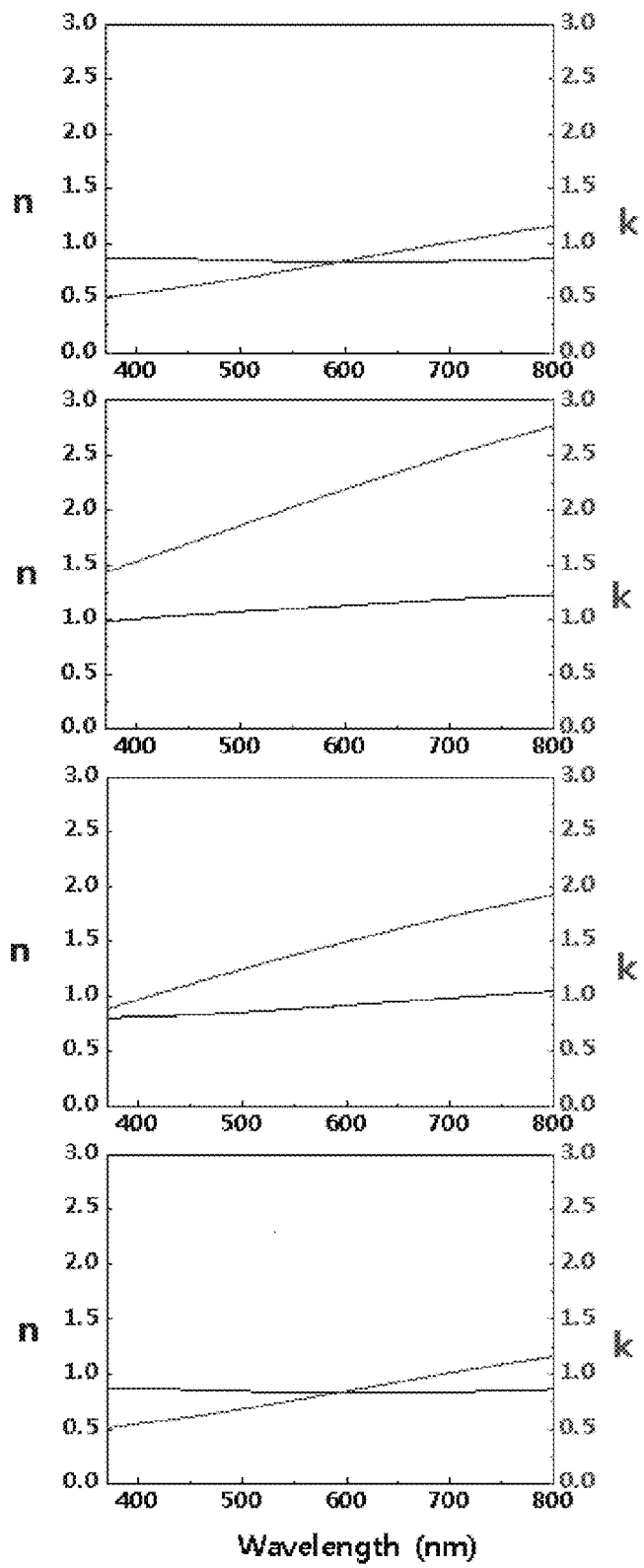

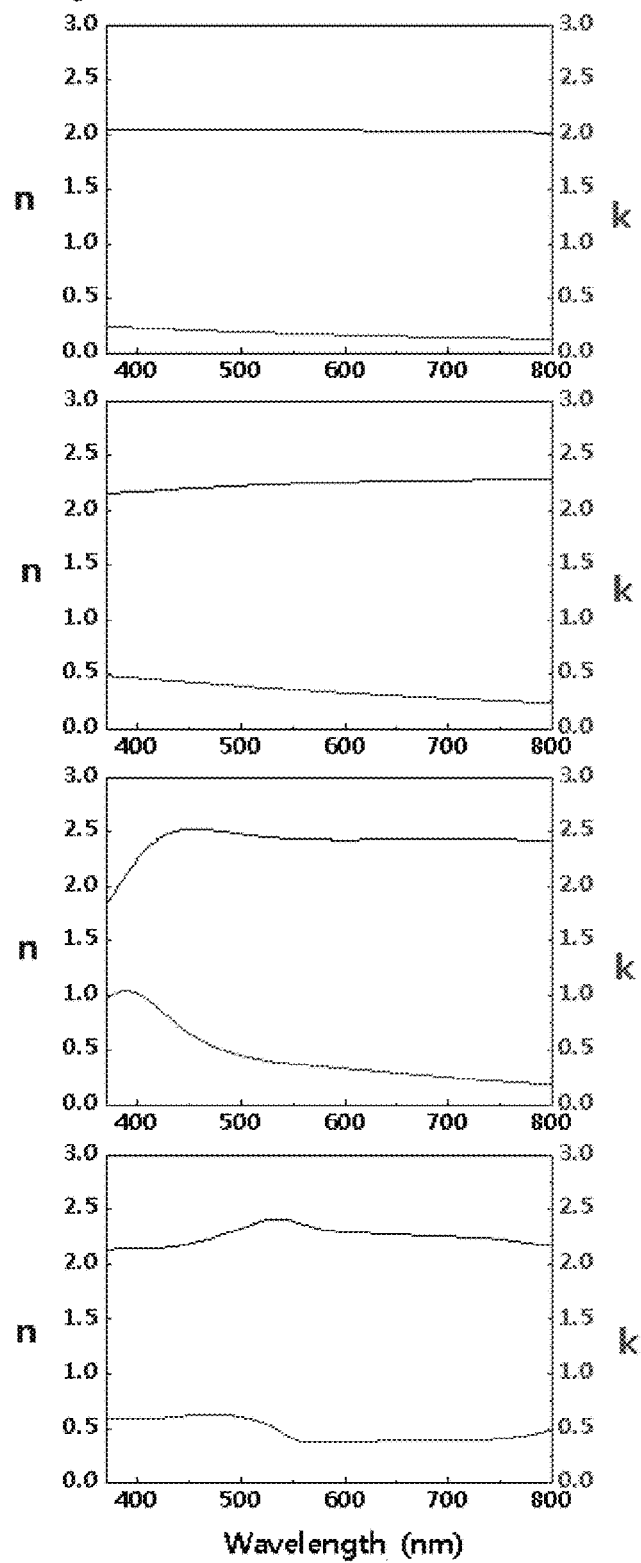
[Figure 7]

【Figure 8】
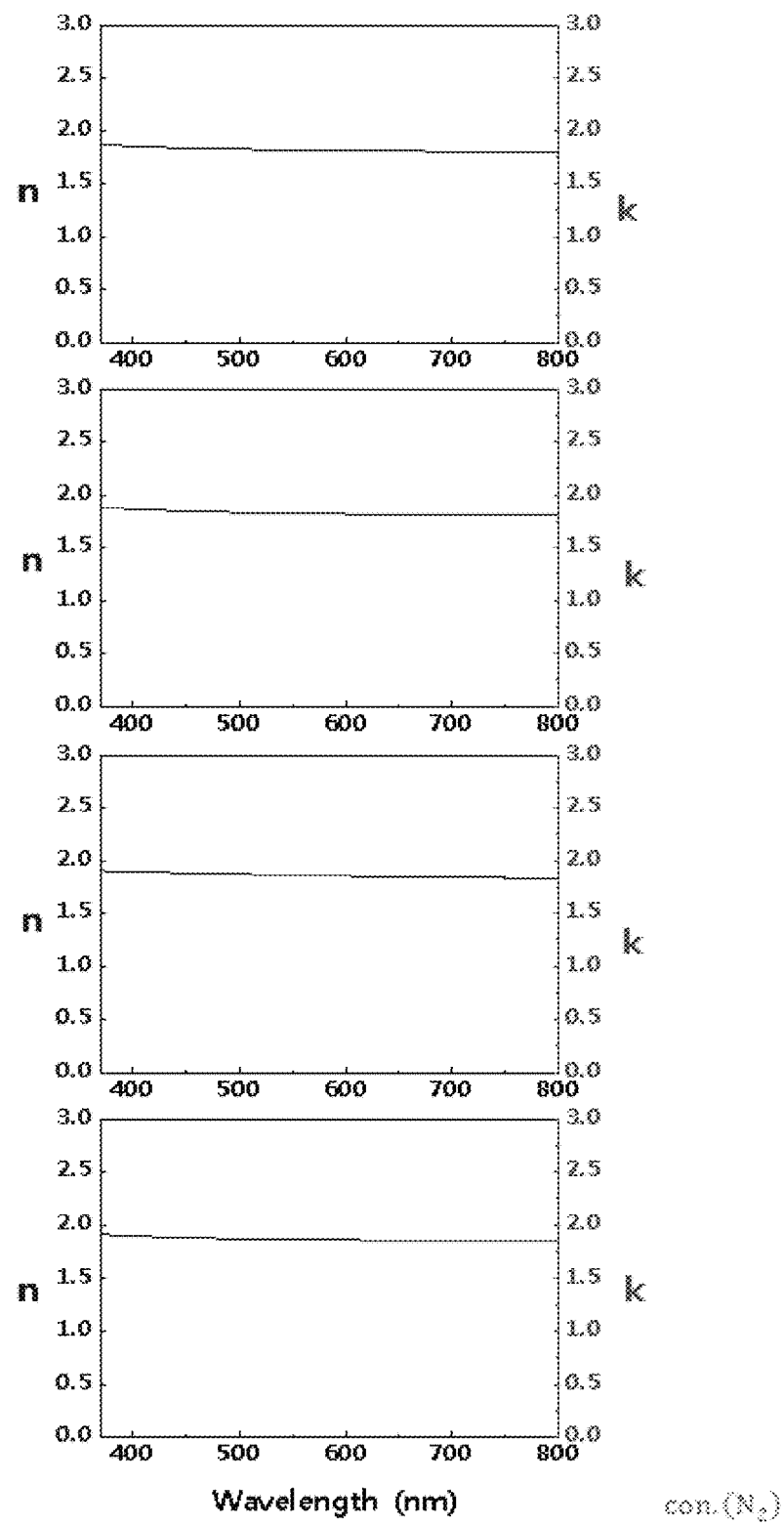

ELECTRICALLY-CONDUCTIVE STRUCTURE AND A PRODUCTION METHOD THEREFOR

The present application is a continuation of U.S. patent application Ser. No. 13/994,448, currently pending, and claims priority to and the benefit of Korean Patent Application No. 10-2011-0019598 filed in the Korean Intellectual Property Office on Mar. 4, 2011, the entire contents of which are incorporated herein by reference.

FIELD

The present specification relates to a conductive structure body and a method for manufacturing the same.

BACKGROUND

Generally, a touch screen panel may be classified into the following types according to a detection manner of signal. That is, there are a resistive type detecting a position pressed by pressure in a state where a direct voltage is applied which changes a current or voltage value, a capacitive type using capacitance coupling in a state where an alternating voltage is applied, an electromagnetic type detecting a selected position in a state where a magnetic field is applied as a change in voltage, and the like.

SUMMARY

The present invention has been made in an effort to develop a technology for improving performance of various modes of touch screen panels in the art.

An exemplary embodiment of the present invention provides a conductive structure body, comprising: a substrate; a conductive pattern layer; and a darkening pattern layer comprising AlOxNy ($0 \leq x \leq 1.5$, $0 \leq y \leq 1$). X and y mean ratios of numbers of O and N atoms to one Al atom, respectively, in AlOxNy.

Another exemplary embodiment of the present invention provides a conductive structure body, comprising: a substrate; a conductive pattern layer; and a AlOxNy darkening pattern layer (x>0, y>0) satisfying the following Equation 1.

$$1 < \frac{(Al)at \times 3}{(O)at \times 2 + (N)at \times 3} < 2 \quad \text{[Equation 1]}$$

X and y mean ratios of numbers of O and N atoms to one Al atom, respectively, in AlOxNy, and (Al)at represents an atomic content (at %) of Al, (O)at represents an atomic content (at %) of O, and (N)at represents an atomic content (at %) of N based on 100% of a content of all elements represented by AlOxNy in Equation 1.

Another exemplary embodiment of the present invention provides a method for manufacturing a conductive structure body, comprising: forming a conductive layer on a substrate; forming a darkening layer comprising AlOxNy ($0 \leq x \leq 1.5$, $0 \leq y \leq 1$) before, after, or before and after the conductive layer is formed; and separately or simultaneously patterning the conductive layer and the darkening layer.

Another exemplary embodiment of the present invention provides a method for manufacturing a conductive structure body, comprising: forming a conductive pattern layer on a substrate; and forming a darkening pattern layer comprising AlOxNy ($0 \leq x \leq 1.5$, $0 \leq y \leq 1$) before, after, or before and after the conductive pattern layer is formed.

Another exemplary embodiment of the present invention provides a method for manufacturing a conductive structure body, comprising: forming a conductive pattern layer on a substrate; and forming a darkening pattern layer comprising AlOxNy (x>0, y>0) having an atomic ratio represented by Equation 1 before, after, or before and after the conductive pattern layer is formed.

Another exemplary embodiment of the present invention provides a method for manufacturing a conductive structure body, comprising: forming a conductive layer on a substrate; forming a darkening layer comprising AlOxNy (x>0, y>0) having an atomic ratio represented by Equation 1 before, after, or before and after the conductive layer is formed; and separately or simultaneously patterning the conductive layer and the darkening layer.

Another exemplary embodiment of the present invention provides a touch screen panel, including the conductive structure body.

Another exemplary embodiment of the present invention provides a display device, comprising the conductive structure body.

Another exemplary embodiment of the present invention provides a solar battery, comprising the conductive structure body.

The conductive structure body according to the exemplary embodiment of the present invention may prevent reflection by a conductive pattern layer without affecting conductivity of the conductive pattern layer, and improve a concealing property of the conductive pattern layer by improving absorbance. Accordingly, a touch screen panel having improved visibility and a display device including the same may be developed by using the conductive structure body according to the exemplary embodiment of the present invention.

BRIEF DESCRIPTION OF THE DRAWINGS

FIGS. 1 to 3 are views illustrating a laminate structure of a conductive structure body including a darkening pattern layer as an exemplary embodiment of the present invention.

FIG. 4 illustrates conductive structure bodies on which a darkening pattern layer is deposited on a glass substrate on which Al is deposited in Example 1 while a reaction condition is changed, and the conductive structure bodies correspond to Comparative Example 6 (#8), Example 2 (#1), and Comparative Example 2 (#12).

FIG. 5 illustrates total reflectance according to wavelengths of Examples 1 to 4 and Comparative Examples 1 to 8.

FIG. 6 illustrates optical constant refractive indexes n and extinction coefficients k of Comparative Examples 1 to 4 measured by an ellipsometer.

FIG. 7 illustrates optical constant refractive indexes n and extinction coefficients k of Examples 1 to 4 measured by an ellipsometer.

FIG. 8 illustrates optical constant refractive indexes n and extinction coefficients k of Comparative Examples 5 to 8 measured by an ellipsometer.

DETAILED DESCRIPTION

Hereinafter, the present invention will be described in more detail.

In the present specification, a display device refers to monitors for a TV or a computer as a whole, and includes a display diode forming an image and a case supporting the display diode.

Examples of the display diode may comprise a plasma display panel (PDP), a liquid crystal display (LCD), an electrophoretic display, a cathode-ray tube (CRT), an OLED display, and the like. An RGB pixel pattern for implementing an image and an additional optical filter may be provided in the display diode.

Meanwhile, relating to a display device, as the spread of smart phones, tablet PCs, and IPTVs is accelerated, a demand for a touch function that uses human hands as a direct input device without a separate input device such as keyboards or remote controllers is growing. In addition, a multi-touch function for recognizing a specific point and taking notes is also required.

Currently, most commercially available touch screen panels (TSP) are based on a transparent conductive ITO thin film, but have problems in that a touch recognition speed is decreased and an additional compensation chip for overcoming the decrease should be introduced because of a RC delay due to relatively high surface resistance of the ITO transparent electrode when a touch screen panel having a large area is applied (minimum 150 Ω/square, ELECRYSTA products manufactured by Nitto Denko, Co., Ltd.).

The present inventors have studied a technology for replacing the transparent ITO thin film by a metal fine pattern. In this regard, the present inventors found that in the case where Ag, Mo/Al/Mo, MoTi/Cu, and the like, which are metal thin films having high electric conductivity, are used as an electrode of a touch screen panel, when a fine electrode pattern having a predetermined shape is to be implemented, there is a problem in that the pattern is easily recognized by the human eye in view of visibility due to high reflectance, and glaring and the like may occur due to high reflectance and haze value to external light. In addition, the present inventors found that a costly target is used during the manufacturing process or there are many cases where the process is complicated.

Accordingly, an exemplary embodiment of the present invention provides a conductive structure body that may be applied to a touch screen panel that may differentiate from a known touch screen panel using an ITO-based transparent conductive thin film layer and has an improved concealing property of a metal fine pattern electrode and improved reflection and diffraction properties to external light.

The conductive structure body according to the exemplary embodiment of the present invention may comprise a darkening pattern layer comprising AlOxNy (0≤x≤1.5, 0≤y≤1). X and y are independent to each other. X and y may be specifically x+y>0, and more specifically x>0 and y>0. Even more specifically, in the case of AlOxNy (0≤x≤0.6, 0.3≤y≤0.8), the case is more effective to form the darkening pattern layer.

X and y mean ratios of numbers of O and N atoms to one Al atom, respectively, in AlOxNy.

The darkening pattern layer may comprise AlOxNy (x>0, y>0) having an atomic ratio represented by the following Equation 1.

$$1 < \frac{(Al)at \times 3}{(O)at \times 2 + (N)at \times 3} < 2 \qquad [\text{Equation 1}]$$

X and y mean ratios of numbers of O and N atoms to one Al atom, respectively, in AlOxNy, and (Al)at represents an atomic content (at %) of Al, (O)at represents an atomic content (at %) of O, and (N)at represents an atomic content (at %) of N based on 100% of a content of all atoms represented by AlOxNy in Equation 1.

Equation 1 is an equation provided in consideration of the atomic content (at %) measured by the XPS (X-ray photo-electron spectroscopy) and a chemical valence. The chemical valence of Al is 3, the chemical valence of O is 2, and the chemical valence of N is 3. If the value of Equation 1 is more than 1, it means that Al is rich among Al, O, and N, and if the value is 1 or less, it means that Al is poor among Al, O, and N. For example, in terms of stoichiometry, in the case of $Al_2O_3$ or AlN, a relatively transparent phase is shown, and the value of Equation 1 becomes 1. If the value obtained in Equation 1 is more than 1, since the content of metal atom Al is higher than that in the case of $Al_2O_3$ or AlN, an absorption coefficient is increased and a darkening layer is formed. If the value obtained in Equation 1 is more than 2, the content of Al is more increased to form a metallic layer.

The extinction coefficient k of the conductive structure body according to the exemplary embodiment of the present invention may be 0.2 or more and 2.5 or less, specifically 0.2 or more and 1.5 or less, and more specifically 0.2 or more and 0.8 or less. If the extinction coefficient k is 0.2 or more, there is an effect facilitating darkening. The extinction coefficient k may be called an absorption coefficient, and is an index defining how strong the conductive structure body absorbs light at a predetermined wavelength and a factor determining transmittance of the conductive structure body. For example, in the case of the transparent conductive structure body such as $Al_2O_3$ or AlN, k is lower than 0.2 and the k value is very low. However, as the number of metal Al atoms is increased, the k value is increased. If the amount of Al is excessively increased to form the conductive structure body mostly consisting of metal, the conductive structure body becomes the metal through which transmission hardly occur but reflection mainly occurs, and the extinction coefficient k is more than 2.5, which is not preferable.

The conductive structure body according to the exemplary embodiment of the present invention may further comprise a substrate and a conductive pattern layer. Herein, the darkening pattern layer may be provided on any one surface of the conductive pattern layer, or both surfaces of the conductive pattern layer.

The conductive structure body according to the exemplary embodiment of the present invention may comprise a substrate; a conductive pattern layer provided on the substrate; and a darkening pattern layer provided on the conductive pattern layer and including AlOxNy (0≤x≤1.5, 0≤y≤1).

The conductive structure body according to the exemplary embodiment of the present invention may comprise a substrate; a darkening pattern layer provided on the substrate and comprising AlOxNy (0≤x≤1.5, 0≤y≤1); and a conductive pattern layer provided on the darkening pattern layer.

The conductive structure body according to the exemplary embodiment of the present invention may comprise a substrate; a darkening pattern layer provided on the substrate and comprising AlOxNy (0≤x≤1.5, 0≤y≤1); a conductive pattern layer provided on the darkening pattern layer; and a darkening pattern layer provided on the conductive pattern layer and including AlOxNy (0≤x≤1.5, 0≤y≤1).

The conductive structure body according to the exemplary embodiment of the present invention may comprise a substrate; a conductive pattern layer provided on the substrate; and a darkening pattern layer provided on the conductive pattern layer and comprising AlOxNy (x>0, y>0) represented by Equation 1.

The conductive structure body according to the exemplary embodiment of the present invention may comprise a substrate; a darkening pattern layer provided on the substrate and comprising AlOxNy (x>0, y>0) represented by Equation 1; and a conductive pattern layer provided on the darkening pattern layer.

The conductive structure body according to the exemplary embodiment of the present invention may comprise a substrate; a darkening pattern layer provided on the substrate and comprising AlOxNy (x>0, y>0) represented by Equation 1; a conductive pattern layer provided on the darkening pattern layer; and a darkening pattern layer provided on the conductive pattern layer and comprising AlOxNy (x>0, y>0) represented by Equation 1.

The present inventors found a fact that light reflection and diffraction properties by the pattern layer significantly affect visibility of the conductive metal fine pattern in a touch screen panel comprising the conductive metal fine pattern provided in an effective screen portion, and tried to improve this. Specifically, a problem by the reflectance of the conductive pattern due to high transmittance of the ITO was not largely considered in a known ITO-based touch screen panel, but it was found that reflectance and darkening properties of the conductive metal fine pattern were important in the touch screen panel including the conductive metal fine pattern provided in the effective screen portion.

The darkening pattern layer may be introduced in order to decrease the reflectance of the conductive metal fine pattern and improve the absorbance property in the touch screen panel according to the exemplary embodiment of the present invention. The darkening pattern layer may be provided on at least one surface of the conductive pattern layer in the touch screen panel to largely prevent a decrease in visibility according to high reflectance of the conductive pattern layer.

In detail, since the darkening pattern layer has light absorptivity, the reflectance by the conductive pattern layer may be decreased by decreasing the quantity of light that is incident on the conductive pattern layer and reflected from the conductive pattern layer. In addition, the darkening pattern layer may have low reflectance as compared to that of the conductive pattern layer. Thereby, since the reflectance of light may be decreased as compared to the case where the user directly observes the conductive pattern layer, visibility of the conductive pattern layer may be largely improved.

In the present specification, the darkening pattern layer means a layer that has light absorptivity to decrease the quantity of light that is incident on the conductive pattern and light that is reflected from the conductive pattern layer, and may be represented by terms such as a light absorption pattern layer, a blackened pattern layer, and a blackening pattern layer in addition to the darkening pattern layer.

In the exemplary embodiment of the present invention, the reflectance of the darkening pattern layer may be 20% or less, specifically 15% or less, more specifically 10% or less, and even more specifically 5% or less, and 3% or less. The effect is increased as the reflectance is decreased.

The reflectance may be measured in a direction of an opposite surface of a surface that is in contact with the conductive pattern layer of the darkening pattern layer. When the reflectance is measured in this direction, the reflectance may be 20% or less, specifically 15% or less, more specifically 10% or less, and even more specifically 5% or less, and 3% or less. The effect is increased as the reflectance is decreased.

In addition, the darkening pattern layer may be provided between the conductive pattern layer and the substrate, and measured in a substrate side. When the reflectance is measured in the substrate side, the reflectance may be 20% or less, specifically 15% or less, more specifically 10% or less, and even more specifically 5% or less, and 3% or less. The effect is increased as the reflectance is decreased.

In the present specification, the reflectance means reflectance of light of 550 nm that is incident at an angle of 90° C. on a surface to be measured after an opposite surface of the surface to be measured is treated by a perfect black layer.

In the exemplary embodiment of the present invention, the reflectance of the conductive structure body may be 20% or less, specifically 15% or less, more specifically 10% or less, and even more specifically 6% or less. The effect is increased as the reflectance is decreased.

In the present specification, when the incident light is 100%, the reflectance may be the measured value on the basis of the value at the wavelength of 550 nm among reflected light reflected by a target pattern layer or a conductive laminate on which light is incident, and this is because the reflectance of the wavelength of 550 nm is not generally largely different from the entire reflectance.

In the conductive structure body according to the exemplary embodiment of the present invention, the darkening pattern layer may comprise a first surface that is in contact with the conductive pattern layer and a second surface facing the first surface. When the reflectance of the conductive structure body is measured at a side of the second surface of the darkening pattern layer, the reflectance (Rt) of the conductive structure body may be calculated by the following Equation 2.

Reflectance (Rt)=reflectance of the substrate+closing ratio×reflectance of the darkening pattern layer [Equation 2]

In addition, in the case where the conductive structure body has a constitution in which two kinds of conductive structure bodies are laminated, the reflectance (Rt) of the conductive structure body may be calculated by the following Equation 3.

Reflectance (Rt)=reflectance of the substrate+closing ratio×reflectance of the darkening pattern layer×2 [Equation 3]

In Equations 2 and 3, the reflectance of the substrate may be reflectance of a touch reinforced glass, and in the case where the surface is a film, the reflectance of the substrate may be reflectance of the film.

In addition, the closing ratio may be represented by an area ratio of a region covered by the conductive pattern, that is, (1−opening ratio), based on a plane of the conductive structure body.

Accordingly, a difference between the case where there is the darkening pattern layer and the case where there is no darkening pattern layer depends on the reflectance of the darkening pattern layer. In this regard, the reflectance (Rt) of the conductive structure body according to the exemplary embodiment of the present invention may be decreased by 10 to 20%, 20 to 30%, 30 to 40%, 40 to 50%, or 50 to 70% as compared to the reflectance (R0) of the conductive structure body having the same constitution, except that there is no darkening pattern layer. That is, in the case where in Equations 2 and 3, the closing ratio range is changed from 1 to 10% and the reflectance range is changed from 1 to 30%, the maximum reflectance decrease effect of 70% may be exhibited, and the minimum reflectance decrease effect of 10% may be exhibited.

In the conductive structure body according to the exemplary embodiment of the present invention, the darkening pattern layer comprises a first surface that is in contact with the conductive pattern and a second surface facing the first surface, and when the reflectance of the conductive structure body is measured at a side of the second surface of the darkening pattern, a difference between the reflectance (Rt) of the conductive structure body and the reflectance (R0) of the substrate may be 40% or less, 30% or less, 20% or less, and 10% or less.

In the exemplary embodiment of the present invention, a refractive index of the conductive structure body may be 0 or more and 3 or less.

In the exemplary embodiment of the present invention, a brightness value L* of the conductive structure body may be 50 or less and more specifically 30 or less based on a L*a*b* color value. The reflectance is decreased as the brightness value is decreased to provide an advantageous effect.

In the exemplary embodiment of the present invention, the surface resistance of the conductive structure body may be 1 Ω/square or more and 300 Ω/square or less, specifically 1 Ω/square or more and 100 Ω/square or less, more specifically 1 Ω/square or more and 50 Ω/square or less, and even more specifically 1 Ω/square or more and 20 Ω/square or less.

If the surface resistance of the conductive structure body is 1 Ω/square or more and 300 Ω/square or less, there is an effect replacing a known ITO transparent electrode. In the case where the surface resistance of the conductive structure body is 1 Ω/square or more and 100 Ω/square or less or 1 Ω/square or more and 50 Ω/square or less, and particularly, in the case where the surface resistance is 1 Ω/square or more and 20 Ω/square or less, since the surface resistance is significantly low as compared to the case where the known ITO transparent electrode is used, there are advantages in that a RC delay is reduced when a signal is applied to significantly improve a touch recognition speed, and accordingly, a touch screen having a large area of 10 inch or more may be easily applied.

In the conductive structure body, the surface resistance of the conductive layer or the darkening layer before patterning may be more than 0 Ω/square and 2 Ω/square or less, and specifically more than 0 Ω/square and 0.7 Ω/square or less. If the surface resistance is 2 Ω/square or less, and particularly 0.7 Ω/square or less, designing of fine patterning and manufacturing process are easily performed as the surface resistance of the conductive layer or the darkening layer before patterning is decreased, and there is an effect that a response speed of the electrode is increased by decreasing the surface resistance of the conductive structure body after patterning.

In the exemplary embodiment of the present invention, a pin hole may not be present in the conductive structure body, and even though the pin hole is present, a diameter thereof may be 3 μm or less, and more specifically 1 μm or less. As described above, in the case where the pin hole is not present in the conductive structure body or the diameter of the pin hole is 3 μm or less, occurrence of a short-circuit may be prevented.

In the exemplary embodiment of the present invention, the darkening pattern layer may be provided on any one surface or both surfaces of the conductive pattern.

In the exemplary embodiment of the present invention, the darkening pattern layer and the conductive pattern layer may be simultaneously or separately patterned.

In the exemplary embodiment of the present invention, the darkening pattern layer and conductive pattern layer may form a laminate structure by a simultaneous or separate patterning process. In this regard, the laminate structure may be differentiated from a structure where at least a portion of a light absorption material is incorporated or dispersed in the conductive pattern, or a structure where a portion at a surface side of the conductive pattern of the single layer is physically or chemically modified by an additional surface treatment.

In addition, in the conductive structure body according to the exemplary embodiment of the present invention, the darkening pattern layer may be directly provided on the substrate or the conductive pattern layer while an attachment layer or adhesive layer is not interposed therebetween. The attachment layer or adhesive layer may affect durability or optical properties. In addition, a method for manufacturing the conductive structure body according to the exemplary embodiment of the present invention is significantly different from that of the case where the attachment layer or adhesive layer is used. Moreover, in the exemplary embodiment of the present invention, an interface property between the substrate or conductive pattern layer and the darkening pattern layer is excellent as compared to the case where the attachment layer or adhesive layer is used.

In the exemplary embodiment of the present invention, the thickness of the darkening pattern layer may be 10 nm or more and 400 nm or less, specifically 30 nm or more and 300 nm or less, and more specifically 50 nm or more and 100 nm or less. The preferable thickness may be changed according to the used material and manufacturing process, but in consideration of an etching property, if the thickness is less than 10 nm, process control may not be easy, and if the thickness is more than 400 nm, there may be a disadvantage in terms of production speed. Specifically, in the case where the thickness is 30 nm or more and 300 nm or less, the process control is easy and the production speed is increased, such that there is an advantage in terms of manufacturing process. If the thickness of the darkening pattern layer is 50 nm or more and 100 nm or less, there is a useful effect in that the reflectance is decreased to facilitate formation of the darkening layer.

In the exemplary embodiment of the present invention, the darkening pattern layer may be formed of a single layer, or a plurality of layers of two or more layers.

In the exemplary embodiment of the present invention, it is preferable that the darkening pattern layer has an achromatic color. In this case, the achromatic color means a color exhibited when light that is incident on a surface of a body is not selectively absorbed but reflected and absorbed uniformly to a wavelength of each component.

In the exemplary embodiment of the present invention, the darkening pattern layer may further comprise at least one of a dielectric material, metal and mixture thereof. Examples of the dielectric material may comprise $SiO$, $SiO_2$, $MgF_2$, $SiN_z$ (z is an integer of 1 or more), and the like, but are not limited thereto. Examples of the metal may comprise Fe, Co, Ti, V, Cu, Al, Au, Ag, and the like, but are not limited thereto. According to the exemplary embodiment of the present invention, the darkening pattern layer may further comprise one or more of the dielectric materials and one or more of metals.

In the exemplary embodiment of the present invention, it is preferable that the dielectric material be distributed in an amount gradually decreased as the dielectric material becomes more distant from an incident direction of external light and the metal be distributed in opposite manner thereof. In this case, the content of the dielectric material may be 20 to 50 wt % and the content of the metal may be 50 to 80 wt %.

In the exemplary embodiment of the present invention, the darkening pattern layer may be provided on any one surface or both surfaces of the conductive pattern layer. Herein, the darkening pattern layer may have a pattern having the same shape as the conductive pattern layer. However, the pattern size of the darkening pattern layer does not need to be completely identical to the conductive pattern layer, and the case where the line width of the darkening pattern layer is narrower or wider as compared to the line width of the conductive pattern layer is also included in the scope of the present invention.

In the exemplary embodiment of the present invention, the darkening pattern layer may have a pattern shape having the line width that is identical with or larger than the line width of the conductive pattern layer. For example, the area of the darkening pattern layer may be 80 to 120% of an area occupied by the conductive pattern layer.

In the case where the darkening pattern layer has the pattern shape having the larger line width than that of the conductive pattern layer, since an effect in which the darkening pattern layer covers the conductive pattern layer when observed by the user may be enlarged, there is an advantage in that an effect by gloss or reflection of the conductive pattern layer may be efficiently blocked. However, even though the line width of the darkening pattern layer is the same as the line width of the conductive pattern layer, a target effect of the present invention can be accomplished.

In the conductive structure body according to the exemplary embodiment of the present invention, a transparent board may be used as the substrate, but the substrate is not particularly limited, and for example, glass, a plastic board, a plastic film, and the like may be used.

In the conductive structure body according to the exemplary embodiment of the present invention, it is preferable that the material of the conductive pattern layer comprise at least one of metal, a metal alloy, metal oxides, metal nitrides and mixture thereof, and the like. It is preferable that the material of the conductive pattern layer be metallic material that has excellent electric conductivity and is easily etched. However, in general, the material having excellent electric conductivity has a disadvantage in that reflectance is high. However, in the exemplary embodiment of the present invention, it is possible to form the conductive pattern layer using the material having high reflectance by using the darkening pattern layer. In the exemplary embodiment of the present invention, in the case where the material having reflectance of 70 to 80% or more is used, the darkening pattern layer may be added to decrease the reflectance, improve a concealing property of the conductive pattern layer, and maintain or improve a contrast property.

In the exemplary embodiment of the present invention, specific examples of the material of the conductive pattern layer may comprise a single film or multilayered film comprising at least one of silver, aluminum, copper, neodymium, molybdenum, nickel, alloys thereof, oxides thereof, nitrides thereof and mixture thereof, and the like, and more specific examples thereof may comprise aluminum, but the specific examples are not limited thereto.

In the exemplary embodiment of the present invention, the thickness of the conductive pattern layer is not particularly limited, but a better effect may be exhibited in terms of electric conductivity of the conductive pattern layer and economic efficiency of the process of forming the pattern when the thickness is 0.01 μm or more and 10 μm or less.

In the exemplary embodiment of the present invention, the line width of the conductive pattern layer may be more than 0 μm and 10 μm or less, specifically 0.1 μm or more and 10 μm or less, more specifically 0.2 μm or more to 8 μm or less, and even more specifically 0.5 μm or more to 5 μm or less.

In the exemplary embodiment of the present invention, the opening ratio of the conductive pattern layer, that is, the ratio of the area not covered by the pattern, may be 70% or more, 85% or more, and 95% or more. In addition, the opening ratio of the conductive pattern layer may be 90 to 99.9%, but is not limited thereto.

In the exemplary embodiment of the present invention, the pattern of the conductive pattern layer may be a regular pattern or irregular pattern.

A pattern shape of the art such as a mesh pattern may be used as the regular pattern. The irregular pattern is not particularly limited, but may be a boundary line shape of figures constituting a Voronoi diagram. In the exemplary embodiment of the present invention, in the case where the irregular pattern and the darkening pattern layer are used together, a diffracted pattern of reflected light by lighting having directivity may be removed by the irregular pattern, and an effect of scattering light may be minimized by the darkening pattern layer, such that the problem in visibility may be minimized.

In the exemplary embodiment of the present invention, when a straight line crossing the conductive pattern is drawn, a ratio of a standard deviation to an average value of distances between adjacent intersection points of the straight line and conductive pattern (distance distribution ratio) may be 2% or more.

In the exemplary embodiment of the present invention, the conductive structure body preventing Moiré and reflective diffraction phenomena and satisfying excellent electric conductivity and optical property may be provided by ensuring the conductive pattern where the ratio of the standard deviation to the average value of distances between the adjacent intersection points of the straight line and the conductive pattern (distance distribution ratio) is 2% or more when the straight line crossing the pattern of the conductive pattern layer is drawn.

It is preferable that the straight line crossing the conductive pattern be a line in which the standard deviation of the distances between adjacent intersection points of the straight line and the conductive pattern has the smallest value. Alternately, the straight line crossing the conductive pattern may be a straight line extending in a direction that is perpendicular to the tangent line of any one point of the conductive patterns.

The ratio of the standard deviation to the average value of distances between the adjacent intersection points of the straight line crossing the conductive pattern and the conductive pattern (distance distribution ratio) may be 2% or more, 10% or more, or 20% or more. The ratio of the standard deviation to the average value of distances between the adjacent intersection points of the straight line crossing the conductive pattern and the conductive pattern (distance distribution ratio) relates to irregularity of the conductive pattern, and in the case where the ratio of the standard deviation is 2% or more, the conductive pattern may have an irregular pattern shape.

It is preferable that the pattern where the ratio of the standard deviation to the average value of distances between the adjacent intersection points of the straight line crossing the conductive pattern and the conductive pattern (distance distribution ratio) is 2% or more occupy 30% or more in respects to the entire area of the substrate. Another type of conductive pattern may be provided on at least a portion of the surface of the substrate that is provided with the conductive pattern described above.

In the exemplary embodiment of the present invention, there may be at least 80 adjacent intersection points of the straight line crossing the conductive pattern and the conductive pattern.

In the exemplary embodiment of the present invention, the conductive pattern is formed of closed figures having a continuous distribution, and a ratio of a standard deviation to an average value of areas of the closed figures (area distribution ratio) may be 2% or more.

In the exemplary embodiment of the present invention, there may be at least 100 closed figures.

In the exemplary embodiment of the present invention, the ratio of the standard deviation to the average value of areas of the closed figures (area distribution ratio) may be 2% or more, 10% or more, or 20% or more. The ratio of the standard deviation to the average value of areas of the closed figures (area distribution ratio) relates to irregularity of the conductive pattern, and in the case where the ratio of the standard deviation is 2% or more, the conductive pattern may have an irregular pattern shape.

It is preferable that the pattern that is formed of the closed figures where the ratio of the standard deviation to the average value of areas thereof (area distribution ratio) is 2% or more occupy 30% or more in respects to the entire area of the substrate. Another type of conductive pattern may be provided on at least a portion of the surface of the substrate that is provided with the conductive pattern described above.

In the exemplary embodiment of the present invention, the conductive pattern layer comprises metal patterns crossing each other, and the number of intersection points between the metal patterns crossing each other per unit area ($cm^2$) of the conductive pattern layer may be 5 to 10,000.

In the exemplary embodiment of the present invention, a pitch of the conductive patterns may be 600 μm or less or 250 μm or less, and may be adjusted according to transmittance and conductivity required by a person with ordinary skill in the art.

In the exemplary embodiment of the present invention, the conductive pattern layer may be a material having specific resistance of appropriately $1 \times 10^6$ Ω·cm or more and $30 \times 10^6$ Ω·cm or less, or $1 \times 10^6$ Ω·cm or more and $7 \times 10^6$ Ω·cm or less.

In the exemplary embodiment of the present invention, the pattern of the conductive pattern layer may have a boundary line shape of the figures forming a Voronoi diagram. In the exemplary embodiment of the present invention, a Moiré phenomenon and a secondary diffraction phenomenon by reflected light may be prevented by forming the conductive pattern in the boundary line shape of the figures forming the Voronoi diagram. The Voronoi diagram refers to a pattern that is formed by filling the closest area to the corresponding dot as compared to the distances of each dot from the other dots if Voronoi diagram generator dots are disposed in a desired area to be filled. For example, when large discount stores in the whole country are represented by dots and consumers try to find the closest large discount store, the pattern that displays the commercial area of each discount store may be exemplified. That is, if the space is filled with a regular hexagon and each dot of the regular hexagon is set by the Voronoi generator, a honeycomb structure may be the conductive pattern. In the exemplary embodiment of the present invention, in the case where the conductive pattern is formed by using the Voronoi diagram generator, there is a merit in that a complex pattern form that can prevent the Moiré phenomenon that may be generated by an interference with another regular pattern may be easily determined. In the exemplary embodiment of the present invention, the pattern obtained from the generator may be used by regularly or irregularly positioning the Voronoi diagram generator. In the case of when the conductive pattern is formed in a boundary line shape of the figures forming the Voronoi diagram, in order to solve the recognition problem as described above, when the Voronoi diagram generator is generated, regularity and irregularity may be appropriately harmonized. For example, after the area having a predetermined size is set as the basic unit in the area in which the pattern is to be provided, the dots are generated so that the distribution of dots in the basic unit has irregularity, thus manufacturing the Voronoi pattern. If the aforementioned method is used, the visibility may be compensated by preventing the localization of the distribution of lines on any one point.

As described above, in the case where the opening ratio of the pattern is made constant in the unit area for uniform conductivity and visibility of the conductor, the number per unit area of the Voronoi diagram generator may be controlled. In this case, when the number per unit area of the Voronoi diagram generator is uniformly controlled, the unit area may be 5 $cm^2$ or less or 1 $cm^2$ or less. The number per unit area of the Voronoi diagram generator may be in the range of 5 to 5,000 generators/$cm^2$ or 100 to 2,500 generators/$cm^2$.

Among the figures forming the pattern in the unit area, at least one may have a shape different from the remaining figures.

In the exemplary embodiment of the present invention, the darkening pattern layer and the conductive pattern layer may have a positive taper angle at a side thereof, but the darkening pattern layer disposed on an opposite surface at a side of the substrate of the conductive pattern layer or the conductive pattern layer may also have a negative taper angle.

Examples of the conductive structure body according to the exemplary embodiment of the present invention are illustrated in the following FIGS. 1 to 3. FIGS. 1 to 3 illustrate the order of lamination of the substrate, the conductive pattern layer, and the darkening pattern layer, and the conductive pattern layer and the darkening pattern layer may not have a front surface layer form but have a pattern shape when being applied as a fine transparent electrode such as a touch screen panel in practice.

According to FIG. 1, there is exemplified the case where a darkening pattern layer 200 is interposed between a substrate 100 and a conductive pattern layer 300. In the case where the user observes the touch screen panel from the substrate side, reflectance by the conductive pattern may be largely decreased. According to FIG. 2, there is exemplified the case where the darkening pattern 200 is disposed on the conductive pattern layer 300. In the case where the user observes the touch screen panel from an opposite surface of the substrate side, reflectance by the conductive pattern may be largely decreased. According to FIG. 3, there is exemplified the case where the darkening pattern layers 200 and 220 are disposed between the substrate 100 and the conductive pattern layer 300 and on the conductive pattern layer 300. In all the case where the user observes the touch screen panel from the substrate side and the case where the user observes the touch screen panel from the opposite side thereof, the reflectance by the conductive pattern may be largely decreased.

The conductive structure body according to the exemplary embodiment of the present invention may have a structure where the darkening pattern layer is provided on at least one surface of the conductive pattern layer.

The structure of the conductive structure body according to the exemplary embodiment of the present invention may be a structure where the substrate, the darkening pattern layer, the conductive pattern layer, and the darkening pattern layer are sequentially laminated. In addition, the conductive structure body may comprise additional conductive pattern and darkening pattern on the darkening pattern of the outermost portion thereof.

That is, the structure of the conductive structure body according to the exemplary embodiment of the present invention may be a structure of substrate/darkening pattern layer/conductive pattern layer, a structure of substrate/conductive pattern layer/darkening pattern layer, a structure of substrate/darkening pattern layer/conductive pattern layer/darkening pattern layer, a structure of substrate/conductive pattern layer/darkening pattern layer/conductive pattern layer, a structure of substrate/darkening pattern layer/conductive pattern layer/darkening pattern layer/conductive pattern layer/darkening pattern layer, or a structure of substrate/darkening pattern layer/conductive pattern layer/darkening pattern layer/conductive pattern layer/darkening pattern layer/conductive pattern layer/darkening pattern layer.

The method for manufacturing the conductive structure body according to the exemplary embodiment of the present invention comprises forming a conductive pattern layer on a substrate; and forming a darkening pattern layer comprising AlOxNy (0≤x≤1.5, 0≤y≤1) before, after, or before and after the conductive pattern layer is formed.

The method for manufacturing the conductive structure body according to the exemplary embodiment of the present invention comprises forming a conductive pattern layer on a substrate; and forming a darkening pattern layer comprising AlOxNy (x>0, y>0) having an atomic ratio represented by Equation 1 before, after, or before and after the conductive pattern layer is formed.

X and y mean ratios of numbers of O and N atoms to one Al atom, respectively, in AlOxNy.

In the exemplary embodiment of the present invention, the method for manufacturing the conductive structure body may comprise forming a darkening pattern layer on a substrate, and forming a conductive pattern layer after the darkening pattern layer is formed.

In the exemplary embodiment of the present invention, the method for manufacturing the conductive structure body may comprise forming a conductive pattern layer on a substrate, and forming a darkening pattern layer after the conductive pattern layer is formed.

In the exemplary embodiment of the present invention, the method for manufacturing the conductive structure body may further comprise forming a darkening pattern layer on a substrate, forming a conductive pattern layer after the darkening pattern layer is formed, and forming a darkening pattern layer after the conductive pattern layer is formed.

In addition, the method for manufacturing the conductive structure body according to the exemplary embodiment of the present invention comprises forming a conductive layer on a substrate; forming a darkening layer comprising AlOxNy (0≤x≤1.5, 0≤y≤1) before, after, or before and after the conductive layer is formed; and separately or simultaneously patterning the conductive layer and the darkening layer.

In addition, the method for manufacturing the conductive structure body according to the exemplary embodiment of the present invention comprises forming a conductive layer on a substrate; forming a darkening layer comprising AlOxNy (x>0, y>0) having an atomic ratio represented by Equation 1 before, after, or before and after the conductive layer is formed; and separately or simultaneously patterning the conductive layer and the darkening layer.

X and y mean ratios of numbers of O and N atoms to one Al atom, respectively, in AlOxNy.

In the exemplary embodiment of the present invention, the method for manufacturing the conductive structure body may comprise forming a darkening layer on a substrate, forming a conductive layer after the darkening layer is formed, forming a darkening layer after the conductive layer is formed, and separately or simultaneously patterning the darkening layer and the conductive layer.

In the exemplary embodiment of the present invention, the darkening pattern layer or the darkening layer may be formed by using a method that is known in the art during the step of forming the darkening pattern layer or the darkening layer, and more specifically a reactive sputtering method may be used, but the method is not limited thereto.

When the reactive sputtering method is used, the reaction condition may satisfy the reaction condition represented by the following Equation 4.

$$7(\%) \leq \frac{con.(N_2)}{con.(Ar) + con.(N_2)} \times 100(\%) \leq 15(\%) \quad \text{[Equation 4]}$$

wherein con.(Ar) and con.(N$_2$) mean contents of Ar and N$_2$ in a reaction chamber, respectively in Equation 4. con.(N$_2$)

The content means a volume.

Specifically, Equation 4 shows a standard cubic centimeter per minute (sccm), which means a ratio of N$_2$ that is a reactive gas among all the plasma gases added into the reaction chamber.

In the exemplary embodiment of the present invention, in the case where the reaction condition satisfies Equation 4, the darkening layer may be formed. In the case where the reaction condition does not satisfy Equation 4, that is, if the value of Equation 4 is less than 7 as the content of nitrogen is relatively increased during the reactive sputtering process, a transparent thin film is formed, and if the value of Equation 4 is more than 15 as the content of nitrogen is relatively decreased, a thin film mostly consisting of metal may be formed.

In the case where the reactive sputtering method is used, various colors may be ensured according to a band gap of metal compound depending on flow ratios by controlling the flow ratios of oxygen and nitrogen without replacing an additional target, and it is possible to perform darkening that can improve a concealing property of the conductive pattern. In addition, the Al single target may be used, and accordingly, there are advantages in that the sputtering process is simplified and batch etching can be performed by a general aluminum etching solution even during an etching process for fine electrode patterning.

In the exemplary embodiment of the present invention, the method for forming the conductive pattern layer is not particularly limited, and the conductive pattern layer may be directly formed by a printing method, or a method for patterning the conductive thin film layer after the conductive thin film layer is formed may be used.

In the exemplary embodiment of the present invention, in the case where the conductive pattern layer is formed by using the printing method, ink or paste of the conductive material may be used, and the paste may further comprise a binder resin, a solvent, a glass frit, or the like in addition to the conductive material.

In the case where the conductive layer is patterned after the conductive layer is formed, a material having an etching resist characteristic may be used.

In the exemplary embodiment of the present invention, the conductive layer may be formed by a method such as evaporation, sputtering, wet coating, vaporization, electrolytic plating or electroless plating, and lamination of a metal foil. A method for applying organic metal, nano metal, or a complex solution thereof on the substrate and then providing conductivity by firing and/or drying may be used as the method for forming the conductive layer. Organic silver may be used as the organic metal, and nano silver particles may be used as the nano metal.

In the exemplary embodiment of the present invention, the patterning of the conductive layer may be performed by using a method using an etching resist pattern. The etching resist pattern may be formed by using a printing method, a photolithography method, a photography method, a method using a mask, or a laser transferring, for example, a thermal transfer imaging, and the printing method or the photolithography method is more preferable, but the method is not limited thereto. The conductive thin film layer may be etched and patterned by using the etching resist pattern, and the etching resist pattern may be easily removed by a strip process.

The exemplary embodiment of the present invention provides a touch screen panel including the conductive structure body. For example, the conductive structure body according to the exemplary embodiment of the present invention may be used as a touch-sensitive type electrode board in a capacitance type touch screen panel.

The exemplary embodiment of the present invention provides a display device including the touch screen panel.

The touch screen panel according to the exemplary embodiment of the present invention may further comprise an additional structure body in addition to the aforementioned conductive structure body including the substrate, the conductive pattern layer, and the darkening pattern layer. In this case, two laminates may be disposed in the same direction, or two structure bodies may be disposed in directions that are opposite to each other. Two or more structure bodies that may be comprised in the touch screen panel according to the exemplary embodiment of the present invention do not need to have the same structure, and only any one and preferably the structure body that is closest to the user may comprise the substrate, the conductive pattern layer, and the darkening pattern layer, and the additional structure body may not comprise the darkening pattern layer. In addition, layer laminate structures in two or more structure bodies may be different from each other. In the case where two or more structure bodies are comprised, an insulation layer may be interposed therebetween. In this case, the insulation layer may further have a function of an adhesive layer.

The touch screen panel according to the exemplary embodiment of the present invention may comprise a lower substrate; an upper substrate; and an electrode layer provided on any one surface of a surface of the lower substrate that is in contact with the upper substrate and a surface of the upper substrate that is in contact with the lower substrate or both the surfaces. The electrode layer may perform the X axis and Y axis position detection functions.

In this case, one or two of the electrode layer provided on the lower substrate and the surface of the lower substrate that is in contact with the upper substrate; and the electrode layer provided on the upper substrate and the surface of the upper substrate that is in contact with the lower substrate may be the conductive structure body according to the exemplary embodiment of the present invention. In the case where only any one of the electrode layers is the conductive structure body according to the exemplary embodiment of the present invention, the other one may have the pattern known in the art.

In the case where the electrode layer is provided on one surface of each of both the upper substrate and the lower substrate to form two electrode layers, an insulation layer or a spacer may be provided between the lower substrate and the upper substrate so as to constantly maintain an interval between the electrode layers and prevent connection therebetween. The insulation layer may comprise an adhesive or an UV or heat curable resin. The touch screen panel may further comprise a ground portion connected to the aforementioned conductive pattern. For example, the ground portion may be formed at an edge portion of the surface on which the conductive pattern of the substrate is formed. At least one of an antireflection film, a polarizing film, and a fingerprint resistant film may be provided on at least one surface of the laminate including the conductive structure body. Other kinds of functional films may be further comprised in addition to the aforementioned functional films according to the design specification. The touch screen panel may be applied to display devices such as an OLED display panel (PDP), a liquid crystal display (LCD), a cathode-ray tube (CRT), and a PDP.

In the touch screen panel according to the exemplary embodiment of the present invention, the conductive pattern layer and the darkening pattern layer may be provided on both surfaces of the substrate, respectively.

The touch screen panel according to the exemplary embodiment of the present invention may further comprise an electrode portion or a pad portion on the conductive structure body. In this case, the effective screen portion, the electrode portion, and the pad portion may be formed of the same conductor.

In the touch screen panel according to the exemplary embodiment of the present invention, the darkening pattern layer may be provided at a side observed by a user.

The exemplary embodiment of the present invention provides a solar battery including the conductive structure body. The solar battery may comprise an anode electrode, a cathode electrode, a photokinesis layer, a hole transport layer and/or an electron transport layer, and the conductive structure body according to the exemplary embodiment of the present invention may be used as the anode electrode and/or the cathode electrode.

The conductive structure body may be used instead of a known ITO in the display device or the solar battery, and may be used to provide flexibility. In addition, the conductive structure body may be used as a next generation transparent electrode in conjunction with CNT, conductive polymers, graphene and the like.

Hereinafter, the present invention will be described in detail with reference to Examples, Comparative Examples, and Experimental Examples. However, the following Examples, Comparative Examples, and Experimental Examples are set forth to illustrate the present invention, but the scope of the present invention is not limited thereto.

EXAMPLE AND COMPARATIVE EXAMPLE

The Al layer having a thickness of 60 to 100 nm was formed as a conductive thin film layer by the reactive sputtering method using the Al single target on the polyethylene terephthalate (PET) substrate, and the darkening layer including AlOxNy was formed by the reactive sputtering method using the Al single target while the thickness was changed to manufacture conductive structure bodies of Examples 1 to 4 and Comparative Examples 1 to 8.

In the case where a value of Equation 4 was 4.3%, the conductive structure bodies of Comparative Examples 1 to 4 were manufactured according to the thickness of the darkening layer. In this case, the case where the thickness of the darkening layer was more than 0 and 32 nm or less was represented by #11 to be set as Comparative Example 1, the case where the thickness of the darkening layer was more than 32 nm and 65 nm or less was represented by #12 to be set as Comparative Example 2, the case where the thickness of the darkening layer was more than 65 nm and 130 nm or less was represented by #4 to be set as Comparative Example 3, and the case where the thickness of the darkening layer was more than 130 nm and 290 nm or less was represented by #10 to be set as Comparative Example 4.

In the case where a value of Equation 4 was 10.8%, the conductive structure bodies of Examples 1 to 4 were manufactured according to the thickness of the darkening layer. In this case, the case where the thickness of the darkening layer was more than 0 and 32 nm or less was represented by #2 to be set as Example 1, the case where the thickness of the darkening layer was more than 32 nm and 65 nm or less was represented by #1 to be set as Example 2, the case where the thickness of the darkening layer was more than 65 nm and 130 nm or less was represented by #6 to be set as Example 3, and the case where the thickness of the darkening layer was more than 130 nm and 290 nm or less was represented by #5 to be set as Example 4.

In the case where a value of Equation 4 was 17.5%, the conductive structure bodies of Comparative Examples 5 to 8 were manufactured according to the thickness of the darkening layer. In this case, the case where the thickness of the darkening layer was more than 0 and 32 nm or less was represented by #9 to be set as Comparative Example 5, the case where the thickness of the darkening layer was more than 32 nm and 65 nm or less was represented by #8 to be set as Comparative Example 6, the case where the thickness of the darkening layer was more than 65 nm and 130 nm or less was represented by #7 to be set as Comparative Example 7, and the case where the thickness of the darkening layer was more than 130 nm and 290 nm or less was represented by #13 to be set as Comparative Example 8.

The following Table 1 shows Examples 1 to 4 and Comparative Examples 1 to 8 performed while the thickness of the darkening layer is changed and the condition of Equation 4 is changed.

Total reflectances according to wavelengths of Examples 1 to 4 and Comparative Examples 1 to 8 are illustrated in FIG. 5. In FIG. 5, $$\frac{N_2}{Ar+N_2}(\%)$$

means $$\frac{con.(N_2)}{con.(Ar)+con.(N_2)} \times 100(\%).$$

Optical constant refractive indexes n and extinction coefficients k of Comparative Examples 1 to 4 measured by an ellipsometer are illustrated in FIG. 6.

In addition, optical constant refractive indexes n and extinction coefficients k of Examples 1 to 4 measured by an ellipsometer are illustrated in FIG. 7.

In addition, optical constant refractive indexes n and extinction coefficients k of Comparative Examples 5 to 8 measured by an ellipsometer are illustrated in FIG. 8.

The following Tables 2 to 4 show an atomic percent of the darkening pattern layer according to the etching time as a composition ratio profile (depth profile) of the darkening layer measured by the X-ray photoelectron spectroscopy (XPS). Table 2 shows Comparative Example 2 (#12), Table 3 shows Example 2 (#1), and Table 4 shows Comparative Example 6 (#8).

TABLE 2

| Etching Time (s) | O | N | Al |
|---|---|---|---|
| 0 | 54.9 | 7.0 | 38.2 |
| 50 | 33.9 | 12.4 | 53.7 |
| 100 | 27.2 | 15.0 | 57.8 |
| 200 | 20.4 | 17.9 | 61.7 |
| 300 | 15.5 | 17.7 | 66.8 |

Etching rate = 30 nm/300 sec

TABLE 3

| Etching Time (s) | O | N | Al |
|---|---|---|---|
| 0 | 52.4 | 12.7 | 34.9 |
| 50 | 24.0 | 27.9 | 48.1 |

TABLE 1

| thickness of AlOxNy (nm) | Metallic layer $\frac{con\bullet(N_2)}{con\bullet(Ar)+con\bullet(N_2)} \times 100(\%) = 4.3(\%)$ | darkening layer $\frac{con\bullet(N_2)}{con\bullet(Ar)+con\bullet(N_2)} \times 100(\%) = 10.8(\%)$ | transparent layer $\frac{con\bullet(N_2)}{con\bullet(Ar)+con\bullet(N_2)} \times 100(\%) = 17.5(\%)$ |
|---|---|---|---|
| ~32 nm | Comparative Examples 1 (#11) | Example 1 (#2) | Comparative Examples 5 (#9) |
| ~65 nm | Comparative Examples 2 (#12) | Example 2 (#1) | Comparative Examples 6 (#8) |
| ~130 nm | Comparative Examples 3 (#4) | Example 3 (#6) | Comparative Examples 7 (#7) |
| ~290 nm | Comparative Examples 4 (#10) | Example 4 (#5) | Comparative Examples 8 (#13) |

TABLE 3-continued

| Etching Time (s) | O | N | Al |
|---|---|---|---|
| 100 | 19.2 | 31.8 | 49.0 |
| 200 | 16.7 | 34.1 | 49.2 |
| 300 | 16.6 | 34.8 | 48.7 |

Etching rate = 30 nm/300 sec

TABLE 4

| Etching Time (s) | O | N | Al |
|---|---|---|---|
| 0 | 44.8 | 18.5 | 36.7 |
| 50 | 26.5 | 28.3 | 45.2 |
| 100 | 23.5 | 30.5 | 46.0 |
| 200 | 22.9 | 31.0 | 46.1 |
| 300 | 23.1 | 30.9 | 46.0 |

Etching rate = 30 nm/300 sec

The Table 5 shows atomic ratios according to Equation 1 as compositions of Comparative Example 2 (#12), Example 2 (#1) and Comparative Example 6 (#8).

TABLE 5

| Composition | Comparative Example 2 (#12) | Example 2 (#1) | Comparative Example 6 (#8) |
|---|---|---|---|
| $\frac{(Al)at \times 3}{(O)at \times 2 + (N)at \times 3}$ | 2.38 | 1.06 | 0.99 |

In the composition of Table 5, (Al)at represents an atomic content (at %) of Al, (O)at represents an atomic content (at %) of O, and (N)at represents an atomic content (at %) of N based on 100% of a content of all atoms represented by AlOxNy.

The composition in Table 5 means a composition of a middle layer at a depth of 30 nm from a surface when the darkening layer is formed in a thickness of 65 nm.

The conductive structure body according to the exemplary embodiment of the present invention and the touch screen panel including the same may prevent reflection by the conductive pattern without affecting conductivity of the conductive pattern and improve a concealing property of the conductive pattern by improving absorbance by introducing the darkening pattern including AlOxNy on at least one surface of the conductive pattern.

In addition, a contrast property of the touch screen panel may be further improved by introducing the darkening pattern as described above. In addition, since the reactive sputtering method is used during the process for manufacturing the darkening pattern including AlOxNy, the Al single target may be used. Accordingly, there are advantages in that a sputtering process is simplified and batch etching can be performed by a general aluminum etching solution even during an etching process for fine electrode patterning.

It will be apparent to those skilled in the art that various modifications and changes may be made without departing from the scope and spirit of the invention.

Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

DESCRIPTION OF REFERENCE NUMERALS

100: Substrate
200: Darkening pattern layer
220: Darkening pattern layer
300: Conductive pattern layer

The invention claimed is:

1. A conductive structure body, comprising:
a substrate;
a conductive pattern layer; and
a darkening pattern layer comprising:
    a dielectric material, and
    AlOxNy (x >0, y >0) satisfying the following Equation 1, $$1 < \frac{(Al)at \times 3}{(O)at \times 2 + (N)at \times 3} < 2 \qquad [\text{Equation 1}]$$

wherein x and y mean ratios of numbers of O and N atoms to one Al atom, respectively, in AlOxNy, and (Al)at represents an atomic content (at %) of Al, (O)at represents an atomic content (at %) of O, and (N)at represents an atomic content (at %) of N based on 100% of a content of all atoms represented by AlOxNy in Equation 1,
wherein an extinction coefficient k of the conductive structure body is 0.2 or more and 1.5 or less, and
wherein the dielectric material is provided in an amount that gradually decreases as the dielectric material becomes more distant from an incident external light.

2. The conductive structure body according to claim 1, wherein an extinction coefficient k of the conductive structure body is 0.2 or more and 0.8 or less.

3. The conductive structure body according to claim 1, wherein a refractive index of the conductive structure body is 0 or more and 3 or less.

4. The conductive structure body according to claim 1, wherein the darkening pattern layer further comprises a metal.

5. The conductive structure body according to claim 1, wherein the dielectric material is selected from the group consisting of SiO, SiO2, MgF2, and SiNz (z is an integer of 1 or more).

6. The conductive structure body according to claim 4, wherein the metal is selected from the group consisting of Fe, Co, Ti, V, Cu, Al, Au, and Ag.

7. The conductive structure body according to claim 1, wherein the darkening pattern layer has an area of 80% to 120% of an area where the conductive pattern layer is occupied.

8. The conductive structure body according to claim 1, wherein a line width of the darkening pattern layer is the same as or larger than a line width of the conductive pattern layer.

9. The conductive structure body according to claim 1, wherein a thickness of the conductive pattern layer is 0.01 μm or more and 10 μm or less.

10. The conductive structure body according to claim 1, wherein a line width of the conductive pattern layer is 10 μm or less.

11. The conductive structure body according to claim 1, wherein the conductive pattern layer comprises a regular pattern.

12. The conductive structure body according to claim 1, wherein the conductive pattern layer comprises an irregular pattern.

13. The conductive structure body according to claim 1, wherein a structure of the conductive structure body is a structure of substrate/darkening pattern layer/conductive pattern layer, a structure of substrate/conductive pattern layer/darkening pattern layer, a structure of substrate/darkening pattern layer/conductive pattern layer/darkening pattern layer, a structure of substrate/conductive pattern layer/darkening pattern layer/conductive pattern layer, a structure of substrate/darkening pattern layer/conductive pattern layer/darkening pattern layer/conductive pattern layer/darkening pattern layer, or a structure of substrate/darkening pattern layer/conductive pattern layer/darkening pattern layer/conductive pattern layer/darkening pattern layer/conductive pattern layer/darkening pattern layer.

14. A touch screen panel, comprising:
the conductive structure body according to claim 1.

15. A display device, comprising:
the conductive structure body according to claim 1.

16. A solar battery, comprising:
the conductive structure body according to claim 1.

17. A method for manufacturing a conductive structure body, comprising:
forming a conductive pattern layer on a substrate; and
forming a darkening pattern layer comprising a dielectric material and AlOxNy (x >0, y >0) having an atomic ratio represented by the following Equation 1 before, after, or before and after the conductive pattern layer is formed, $$1 < \frac{(Al)at \times 3}{(O)at \times 2 + (N)at \times 3} < 2 \quad \text{[Equation 1]}$$

wherein x and y mean ratios of numbers of O and N atoms to one Al atom, respectively, in AlOxNy, and (Al)at represents an atomic content (at %) of Al, (O)at represents an atomic content (at %) of O, and (N)at represents an atomic content (at %) of N based on 100% of a content of all atoms represented by AlOxNy in Equation 1, and
wherein the darkening layer is formed by using a reactive sputtering method, and
wherein the dielectric material is provided in an amount that gradually decreases as the dielectric material becomes more distant from an incident external light.

18. The conductive structure body according to claim 10, wherein a line width of the darkening pattern layer is narrower or wider than the line width of the conductive pattern layer.

* * * * *